US008855247B2

(12) United States Patent
Mori et al.

(10) Patent No.: US 8,855,247 B2
(45) Date of Patent: Oct. 7, 2014

(54) WIRELESS RECEIVING APPARATUS AND METHOD

(75) Inventors: Hiroki Mori, Kawasaki (JP); Masaki Ogata, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 125 days.

(21) Appl. No.: 13/569,639

(22) Filed: Aug. 8, 2012

(65) Prior Publication Data
US 2013/0044841 A1 Feb. 21, 2013

(30) Foreign Application Priority Data

Aug. 19, 2011 (JP) ................. 2011-179475

(51) Int. Cl.
*H04L 27/06* (2006.01)
*H04L 27/20* (2006.01)
*H04L 27/34* (2006.01)
*H04L 27/22* (2006.01)
*H03M 13/23* (2006.01)

(52) U.S. Cl.
CPC ............... *H04L 27/06* (2013.01); *H04L 27/20* (2013.01); *H04L 27/3444* (2013.01); *H04L 27/22* (2013.01); *H03M 13/23* (2013.01)
USPC ........... 375/341; 375/340; 375/316; 375/130; 375/140; 375/147

(58) Field of Classification Search
USPC .................. 375/341, 340, 316, 130, 140, 147
See application file for complete search history.

(56) References Cited

U.S. PATENT DOCUMENTS

| 4,726,029 A | 2/1988 | Motley et al. | |
| 6,035,040 A * | 3/2000 | Mann et al. ............ | 380/28 |
| 6,934,317 B1 * | 8/2005 | Dent ............................ | 375/140 |
| 7,752,430 B2 * | 7/2010 | Dzung ........................ | 713/151 |
| 8,391,228 B2 * | 3/2013 | Batra et al. .................. | 370/329 |
| 2001/0004377 A1 * | 6/2001 | Lee et al. ..................... | 375/141 |
| 2010/0111145 A1 * | 5/2010 | Trachewsky et al. ........ | 375/220 |
| 2011/0110457 A1 * | 5/2011 | Lakkis ......................... | 375/295 |

FOREIGN PATENT DOCUMENTS

| JP | 62122349 A | 6/1987 |
| JP | 11215200 A | 8/1999 |
| JP | 5014213 B2 | 8/2012 |
| JP | 2012182586 A | 9/2012 |
| WO | 2011082828 A1 | 7/2011 |

OTHER PUBLICATIONS

J.G. Proaki; "Digital Communications"; 4th edition, McGraw-Hill, 2000; pp. 1-3; 246-251 and 440-461).
Japanese Office Action dated Mar. 11, 2014 in counterpart Japanese Application No. 2011-179475.

* cited by examiner

*Primary Examiner* — Kenneth Lam
(74) *Attorney, Agent, or Firm* — Holtz Holtz Goodman & Chick PC

(57) ABSTRACT

According to one embodiment, a wireless receiving apparatus includes a receiver, a phase rotation module and a demodulator. The receiver receives a first signal, the first signal being processed a bit conversion, a scramble and an M-phase shift keying modulation processes. The phase rotation module multiplies a first symbol obtained from the first signal with an amount of phase rotation determined by a scramble sequence used for the scramble, to obtain a second symbol. The demodulator demodulates the second symbol by referring to signal points of N-PSK replica signal generated based on a data rate and the bit conversion process and calculates a likelihood obtained from demodulation as a soft decision value.

6 Claims, 3 Drawing Sheets

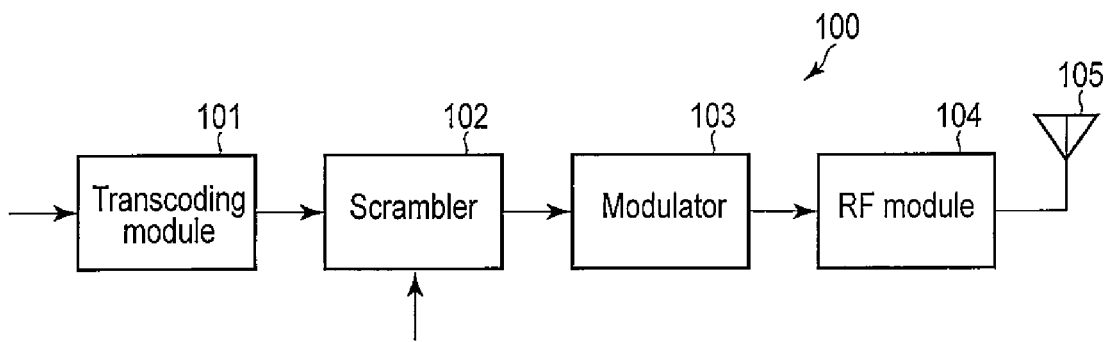
F I G. 1
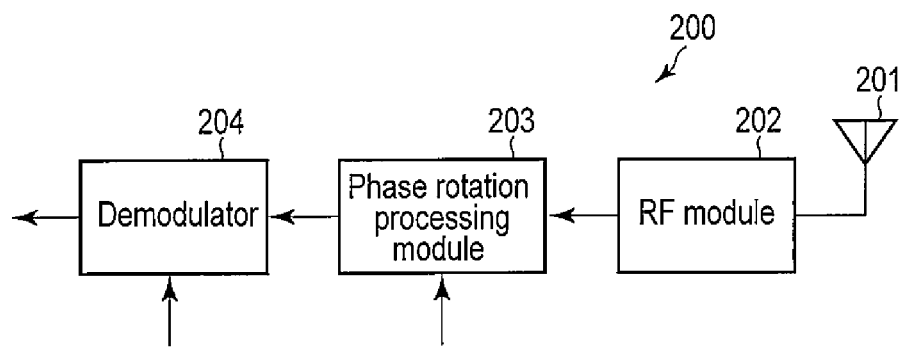
F I G. 2
| Output bit | Input bit | | |
|---|---|---|---|
| | 150,300,600bps | 1200bps | 2400,4800bps |
| 000 | 0 | 00 | 000 |
| 001 | | | 001 |
| 010 | | 01 | 011 |
| 011 | | | 010 |
| 100 | 1 | 11 | 110 |
| 101 | | | 111 |
| 110 | | 10 | 101 |
| 111 | | | 100 |
F I G. 3

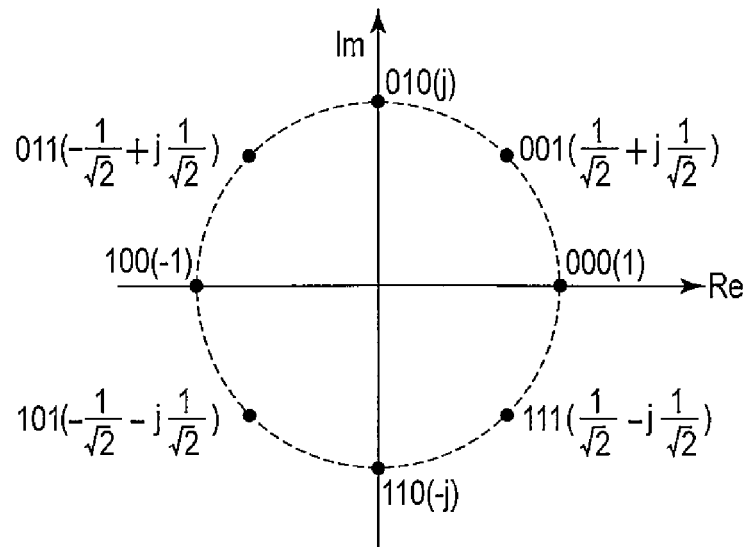
F I G. 4
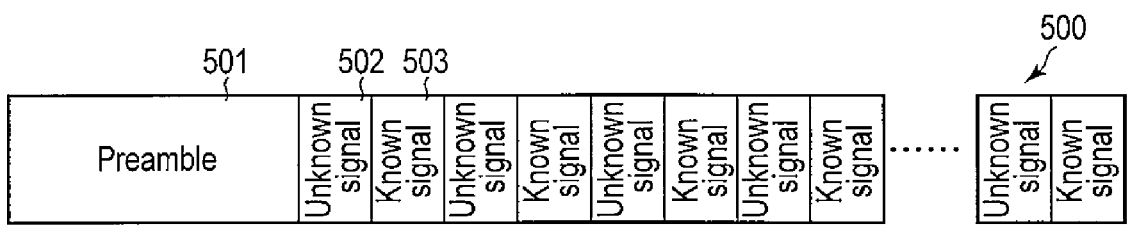
F I G. 5

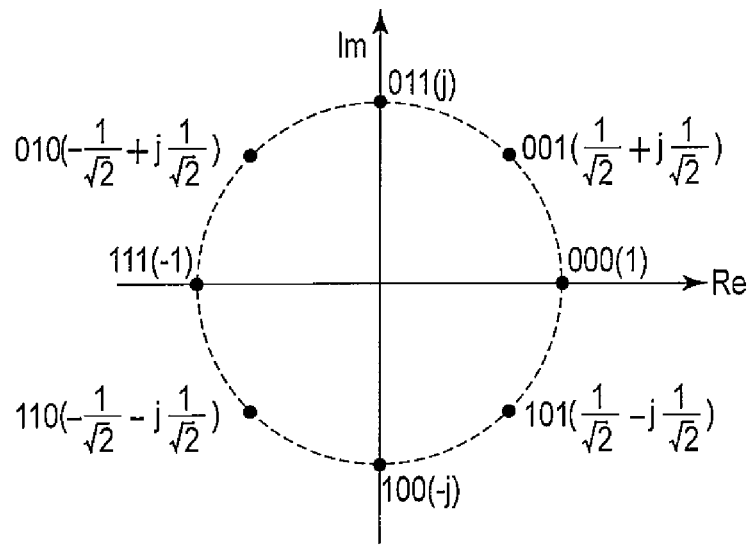
F I G. 6
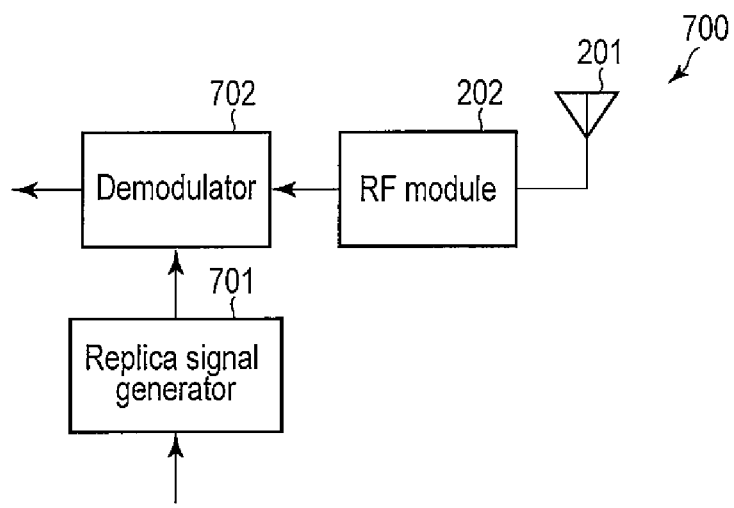
F I G. 7

WIRELESS RECEIVING APPARATUS AND METHOD

CROSS-REFERENCE TO RELATED APPLICATIONS

This application is based upon and claims the benefit of priority from prior Japanese Patent Application No. 2011-179475, filed Aug. 19, 2011, the entire contents of which are incorporated herein by reference.

FIELD

Embodiments described herein relate generally to wireless receiving apparatus and method.

BACKGROUND

There is a wireless receiving apparatus for receiving a frame generated by carrying out a transcoding process, a scramble process, a modulation process on encoded data. With this wireless receiving apparatus, desired data can be obtained by performing processing that corresponds to a frame generation process at a wireless transmitting apparatus, namely, a demodulation process, a descramble process, a trans-decoding process.

BRIEF DESCRIPTION OF THE DRAWINGS

FIG. 1 is a block diagram of a wireless transmitting apparatus.
FIG. 2 is a block diagram of a wireless receiving apparatus according to the first embodiment.
FIG. 3 is an example of a reference table used for transcoding.
FIG. 4 is an example of 8 phase-shift keying (8-PSK) constellation points.
FIG. 5 is an example of a frame format that conforms to a military standard.
FIG. 6 is an example of 8-PSK constellation points in decoding.
FIG. 7 is a block diagram of a wireless receiving apparatus according to the second embodiment.

DETAILED DESCRIPTION

Generally, a soft decision value (a value indicates how likely a symbol is 0 or 1) can achieve better performance than a hard decision value (a value indicating that a symbol is 0 or 1). However, at a wireless receiving apparatus for receiving a frame generated by carrying out transcoding, a scramble process, and modulation in the order as mentioned on encoded data to be transmitted, when demodulation, a descramble process, and a trans-decoding process that correspond to the frame generation process at the wireless transmitting apparatus are performed, the descramble process and the trans-decoding process should be performed in bit-base. Accordingly, data processing can only be performed with a hard decision value, and a soft decision value cannot be used for decoding after trans-decoding process.

In general, according to one embodiment, a wireless receiving apparatus includes a receiver, a phase rotation module and a demodulator. The receiver is configured to receive a first signal, the first signal being processed a bit conversion process, a scramble process and an M-phase shift keying modulation process, M being a positive integer. The phase rotation module is configured to multiply a first symbol obtained from the first signal with an amount of phase rotation determined by a scramble sequence used for the scramble process to obtain a second symbol. The demodulator is configured to demodulate the second symbol by referring to signal points of N-phase shift keying (N-PSK) replica signal generated based on a data rate and the bit conversion process and to calculate a likelihood obtained from demodulation as a soft decision value, N being an integer and 1<N<M.

In the following, a wireless receiving apparatus and method according to an embodiment of the present disclosure will be described in detail with reference to the drawings. In the explanation of the embodiments below, each structure element will be explained once for brevity.

The present embodiment will be described in accordance with MIL-STD-188-110b (hereinafter, MIL-STD). However, the embodiment is not limited to MIL-STD; rather, the wireless receiving apparatus according to the present embodiment can be used for other standards.

First Embodiment

A standard wireless transmitting apparatus will be explained with reference to FIG. 1.

A wireless transmitting apparatus 100 includes a transcoding module 101, a scrambler 102, a modulator 103, a radio frequency (RF) module 104, and an antenna 105.

The transcoding module 101 acquires from an encoding module (not shown) a transmit bit sequence on which an encoding process (for example, convolutional encoding and interleaving) performed, and performs a bit conversion process to generate a channel symbol.

The scrambler 102 acquires the channel symbol from the transcoding module 101, and a scramble sequence from outside of the apparatus. The scrambler 102 randomizes the channel symbol to obtain a scramble symbol.

The modulator 103 modulates the scramble symbol acquired from the scrambler 102, to map the symbol on constellation points on a complex plane in accordance with a predetermined modulation scheme. Any modulation scheme can be adopted for the modulation, as long as a wireless receiving apparatus 200 that communicates with the wireless transmitting apparatus 100 can demodulate the modulated symbol. For example, a PSK scheme, such as binary phase-shift keying (BPSK) and quadrature phase-shift keying (QPSK), can be adopted.

The RF module 104 performs signal processing on the modulated symbol acquired from the modulator 103, and generates a transmit symbol. The signal processing is, for example, digital-to-analog conversion using a digital-to-analog converter (DAC), up-conversion using a frequency converter, or a power amplification process using a power amplifier.

The antenna 105 transmits the transmit symbol acquired from the RF module 104 to an external wireless receiving apparatus, etc. as a transmit signal. As the antenna 105 can be any antenna with common configuration, specific explanation of the antenna 105 is omitted.

Next, the wireless receiving apparatus according to the first embodiment is explained with reference to FIG. 2.

The wireless receiving apparatus 200 according to the first embodiment includes an antenna 201, an RF module 202, a phase rotation processing module 203, and a demodulator 204.

The antenna 201 receives a signal transmitted from the wireless transmitting apparatus 100. As the antenna 201 can be any common antenna, specific explanation of the antenna 201 is omitted.

The RF module 202 acquires the received signal from the antenna 201, and performs signal processing on the acquired signal to obtain a symbol (it may be referred to as "a first symbol"). The signal processing is, for example, analog-to-digital conversion using an analog-to-digital converter (ADC), down-conversion using a frequency converter, a power amplification process using a power amplifier, and channel equalization using an equalizer. In the channel equalization, most-likelihood sequence estimate is carried out, for example.

The phase rotation processing module 203 acquired the first symbol from the RF module 202 and a scramble sequence from outside of the apparatus. The phase rotation processing module 203 performs phase rotation processing on the first symbol in accordance with the scramble sequence, and obtains a rotated symbol (hereinafter, may be referred to as "a second symbol"). The scramble sequence is same as the one used at the wireless transmitting apparatus 100. Under MIL-STD, a predetermined scramble sequence generator is used, and an initial value for a shift register is defined; thus, the same scramble sequence can be generated by both of the wireless receiving apparatus 200 and the wireless transmitting apparatus 100.

The demodulator 204 acquires the second symbol from the phase rotation processing module 203, and receives a replica signal from outside of the apparatus. The demodulator 204 demodulates the second symbol based on the replica signal, and calculates a likelihood obtained from the demodulation as a soft decision value. Then, the soft decision value is transmitted to the demodulation processing module (not shown), and used for decoding.

Next, an example of a reference table used for transcoding is explained with reference to FIG. 3.

The reference table of FIG. 3 shows the correspondence between an input bit 301 and an output bit 302 based on transcoding conformant to MIL-STD. Although MIL-STD supports the data rate of 75, 150, 300, 600, 1200, 2400 and 4800 bps, an example in which the data rate is 2400 bps or below will be explained in the following.

As shown in FIG. 3, the input bit 301 can be 1, 2, or 3 bits in accordance with a data rate; on the other hand, the output bit 302 is always 3 bits. For example, if the data rate is 2400 bps, a bit sequence after decoding is subjected to a bit conversion for every 3 bits. As a result, if the input bit 301 is (000, 001, 010, 011, 100, 101, 110, 111), the output bit 302 is (000, 001, 011, 010, 111, 110, 100, 101). If the data rate is 1200 bps, the input bit 301 is 2 bits, and the output bit 302 is 3 bits, and if the input bits 301 is (00, 01, 10, 11), the output bit 302 is (000, 010, 110, 100).

Next, the process at the scrambler 102 is explained.

A transmitted bit sequence of 3 bits output after transcoding (the output bits shown in FIG. 3) is randomized by 3-bit sum operation with a 3-bit scramble sequence which is generated by a scramble sequence generator (not shown) including a predetermined shift register. For example, if a 3-bit transmitted bit sequence output after the transcoding process is (001), and a scramble sequence generated by the scramble sequence generator is (101), the transmit bit sequence after the randomization will be $001_{(2)}+101_{(2)}=110_{(2)}$. The subscript (2) indicates that those numbers are binary numbers. It should be noted that with a MIL-STD-conformant scramble sequence generator, a shift register value is initialized every 160 three-bit scramble sequences, and a 3-bit scramble sequence is generated for 160 times repeatedly.

Next, the modulation process at the modulator 103 is explained with reference to FIG. 4.

The 3-bit scramble symbol randomized at the scrambler 102 is mapped to 8-PSK signal points as shown in FIG. 4, and modulation symbols are generated. In other words, when scramble symbols are (000, 001, 010, 011, 100, 101, 110, 111), modulation symbols generated by mapping to 8-PSK signal points will be the following values.

$$1, \frac{1}{\sqrt{2}} + j\frac{1}{\sqrt{2}}, j, -\frac{1}{\sqrt{2}} + j\frac{1}{\sqrt{2}}, \qquad (1)$$
$$-1, -\frac{1}{\sqrt{2}} - j\frac{1}{\sqrt{2}}, -j, \frac{1}{\sqrt{2}} - j\frac{1}{\sqrt{2}}$$

In the above values, $j=\sqrt{(-1)}$. According to MIL-STD, modulation symbol generation is always achieved by mapping using 8-PSK signal points, regardless of data rate.

Next, an example of a frame format according to the MIL-STD will be explained with reference to FIG. 5.

After the above-explained modulation symbols are generated, a frame such as a frame 500 shown in FIG. 5 is generated. The frame 500 includes a preamble 501, an unknown signal 502, and a known signal 503.

The preamble 501 is arranged at the beginning of the frame 500, and is formed of known signals of 1440 symbols or 11520 symbols. The preamble 501 is used for timing synchronization.

The unknown signal 502 is arranged after the preamble 501, and is formed of 20 symbols or 32 symbols. The unknown signal 502 is a data signal to be transmitted to the destination.

The known signal 503 is arranged after the unknown signal 502, and is formed of 16 symbols or 20 symbols. The known signal 502 is used for channel estimation. The unknown signal 502 and the known signal 503 are arranged alternately in the frame 500.

Next, the phase rotation process at the phase rotation processing module 203 of the wireless receiving apparatus 200 will be explained.

If kth received symbol is y(k), the second symbol y'(k) after a phase rotation process can be expressed as follows:

$$y'(k) = y(k) \times \exp\left(-j\frac{\pi S(k)}{4}\right) \qquad (2)$$

Herein, S(k) is a scramble sequence converted in decimal numbers for kth symbol expressed with 3 bits, and may be a value between 0 and 7. For example, if a scramble sequence corresponding to kth symbol is (101), S(k) is 5.

Thus, a process equivalent to a de-scramble process can be performed by rotating the phase of a received symbol.

Next, the demodulation at the demodulator 204 will be explained with reference to FIG. 6.

A replica signal used at the demodulator 204 is generated by relating a symbol to a bit sequence at 8-PSK signal points in accordance with trans-decoding process. In other words, a replica signal is different from the 8-PSK signal points in the modulator 103 shown in FIG. 4, and is expressed as a pair between a bit sequence and a symbol of the 8-PSK signal point at the demodulator 204, as shown below:

$$(000, 1), \left(001, \frac{1}{\sqrt{2}} + j\frac{1}{\sqrt{2}}\right), \left(010, -\frac{1}{\sqrt{2}} + j\frac{1}{\sqrt{2}}\right), (011, j), \qquad (3)$$

$$(100, -j), \left(101, \frac{1}{\sqrt{2}} - j\frac{1}{\sqrt{2}}\right), \left(110, -\frac{1}{\sqrt{2}} - j\frac{1}{\sqrt{2}}\right), (111, -1)$$

In the indication (A, B) in the following, A represents a bit sequence, and B represents a PSK signal point corresponding to the bit sequence (A). The demodulator 204 uses the replica signal at 8-PSK signal points as shown in the above expression (3) to perform second symbol de-mapping. The expression (4) below is used for de-mapping, for example, to calculate a log-likelihood ratio $\lambda_n$ of each bit for each received symbol.

$$\lambda_n = \ln \frac{\sum_{x \in (b=0)} \exp\left(\frac{|y' - \hat{h}x|^2}{\sigma^2}\right)}{\sum_{x \in (b=1)} \exp\left(\frac{|y' - \hat{h}x|^2}{\sigma^2}\right)} \quad (4)$$

where n is nth bit in a received symbol, b is a transmitted bit, y' is a rotated received symbol, x is a replica signal mapped at an 8-PSK signal points, $x \in (b)$ is an 8-PSK signal point having a value of b in nth bit, $\hat{h}$ is an equalized gain that is a variable indicating a channel influence, and $\sigma^2$ is an equalized interference noise variance.

A log-likelihood ratio $\lambda_n$ may be calculated using Expression (5) below:

$$\lambda_n = \frac{\max_{x \in (b=1)} |y - \hat{h}x|^2 - \max_{x \in (b=0)} |y - \hat{h}x|^2}{\sigma^2} \quad (5)$$

The demodulator 204 can demodulate a signal using the log-likelihood ratio as a soft decision value. The de-mapping performed herein is not limited to the procedures expressed in expressions (4) and (5); rather, any procedure for converting a received symbol to a received bit can be adopted. Thus, a received bit sequence same as the one obtained when performing usual de-mapping, descramble, and trans-decoding on a received symbol can be obtained by the phase rotation processing module 203 and the demodulator 204 according to the present embodiment.

As a specific example, suppose if the wireless transmit apparatus 100 transmits a transmit bit sequence (001) to the wireless receiving apparatus 200.

In the wireless transmitting apparatus, a scramble symbol (110) can be obtained as a result of a transcoding process performed at the transcoding module 101, and a scramble process performed at the scrambler 102, as described above. Then, the transmit symbol becomes as a result of a mapping process performed based on 8-PSK signal points shown in FIG. 4 at the modulator 103.

On the other hand, if a symbol [−j] is received at the RF module 202 of the wireless receiving apparatus 200, the second symbol will be [1/√2+j×1√2] as the scramble sequence of the wireless transmitting apparatus 100 is (101) according to Expression (2) at the phase rotation processing module 203. Subsequently, if demodulation is performed by de-mapping based on a replica signal as shown in FIG. 6 and Expression (3) at the demodulator 204, a received bit sequence (001) corresponding to the second symbol [1/√2+j×1√2] can be obtained. In other words, a transmitted bit sequence is demodulated by the wireless receiving apparatus 200 according to the present embodiment, and a log-likelihood ratio for a received bit sequence (001) can be used as a soft decision value.

It is not always necessary to use replica signals as 8-PSK signal points in order to calculate a log-likelihood ratio. In the case of 1200 bps, a log-likelihood ratio can be calculated using QPSK signal points, (bit sequence, symbol)=(00, 1), (01, j) (10, −j), (11, −1), as a replica signal. Similarly, if data rates are 150, 300, and 600 bps, a log-likelihood ratio can be calculated using BPSK signal points, (bit sequence, symbol) =(0, 1) (1, −1) as replica signal. Thus, in the process of calculating a log-likelihood ratio, when the data rate is 150, 300, 600, or 1200 bps, an amount of calculation can be reduced by reducing the number of candidate points corresponding to PSK point signals.

Further, in the RF module 202 of the wireless receiving apparatus 200, if a most-likelihood sequence estimation is adopted as a channel equalization method, it is generally known that an amount of calculation with most-likelihood sequence estimation increase in accordance with a modulation multi-valued number and delay path time of a propagation path. As in the wireless receiving apparatus according to the present embodiment, a modulation multi-valued number can be reduced from 8 (in the case of 8-PSK to 4, or 2 (in the case of QPSK or BPSK) when a data rate is low by using signal points corresponding to bit sequences and symbols in consideration of transcoding process. Thus, an amount of calculation can be reduced as the number of candidates is reduced.

As the replica signal according to the first embodiment is determined in accordance with a data rate, a replica signal determined based on a data rate may be stored in an information storage medium, such as a read-only memory (ROM), and demodulation process may be performed on a replica signal read from the ROM.

According to the first embodiment as described above, by performing phase rotation corresponding to scramble process on a received symbol, and demodulation process using a replica signal corresponding to trans-decoding process, a soft decision value can be calculated without degrading signal performance and increasing an amount of processing. Thus, a soft decision value can be used for demodulation process later; as a result, decoding process with high accuracy can be achieved.

Second Embodiment

The second embodiment is different from the first embodiment with respect to performing phase rotation on a replica signal, not on a received signal, at a wireless receiving apparatus.

The wireless receiving apparatus according to the second embodiment will be explained with reference to the block diagram of FIG. 7.

A wireless receiving apparatus 700 according to the second embodiment comprises an antenna 201, an RF module 202, a replica signal generator 701, and a demodulator 702. As the antenna 201 and the RF module 202 perform the same process as the first embodiment, the detailed explanation is omitted.

The replica signal generator 701 receives a scramble sequence from the outside of the apparatus, performs phase rotation on a replica signal (maybe referred to as "a first replica signal") that is determined by a data rate and a bit conversion process based on the scramble sequence, and generates a replica signal (maybe referred to as "a second replica signal").

The demodulator 702 acquires a received symbol from the RF module 202, and the second replica signal from the replica signal generator 701, and demodulates the received symbol based on the second replica signal to calculate a likelihood obtained by the demodulation as a soft decision value.

The operation of the wireless receiving apparatus 700 according to the second embodiment is explained below.

The replica signal generator 701 generates a replica signal X (a first replica signal) corresponding to the transcoding shown as Expression (3) above. Then, as shown in Expression (6) below, phase rotation is performed on the first replica signal in accordance with a scramble sequence S(k) to obtain a replica signal X' (a second replica signal).

$$X'(k) = X(k) \times \exp\left(-j\frac{\pi S(k)}{4}\right) \quad (6)$$

The demodulator 702 calculates a log-likelihood ratio based on the second replica signal X'(k). The first replica signal X in Expression (6) is all replica signals on a complex plane using vectors. If a data rate is 2400 or 4800 bps, the signal X can be expressed as follows:

$$X = \left[1, \frac{1}{\sqrt{2}} + j\frac{1}{\sqrt{2}}, j, -\frac{1}{\sqrt{2}} + j\frac{1}{\sqrt{2}}, -1, -\frac{1}{\sqrt{2}} - j\frac{1}{\sqrt{2}}, -j, \frac{1}{\sqrt{2}} - j\frac{1}{\sqrt{2}}\right]^T \quad (7)$$

When a data rate is 1200 bps, the signal X can be expressed as follows:

$$X = [1, j, -1, -j]^T \quad (8)$$

When a data rate is 150, 300, or 600 bps, the signal X can be expressed as follows:

$$X = [1, -1]^T \quad (9)$$

For example, when a data rate is 2400 bps, a scramble sequence is (010), i.e., 2, the correspondence between a bit sequence and a symbol of the second replica signal X'(k) can be expressed as follows:

$$(000, j), \left(001, -\frac{1}{\sqrt{2}} + j\frac{1}{\sqrt{2}}\right), \left(010, -\frac{1}{\sqrt{2}} - j\frac{1}{\sqrt{2}}\right), (011, -1), \quad (10)$$
$$(100, 1), \left(101, \frac{1}{\sqrt{2}} + j\frac{1}{\sqrt{2}}\right), \left(110, \frac{1}{\sqrt{2}} - j\frac{1}{\sqrt{2}}\right), (111, -j)$$

If a data rate is 300 bps and a scramble sequence is (101), i.e., 5, the pair of a bit sequence and a symbol of the second replica signal X'(k) can be expressed as follows:

$$\left(00, -\frac{1}{\sqrt{2}} - j\frac{1}{\sqrt{2}}\right), \left(01, \frac{1}{\sqrt{2}} - j\frac{1}{\sqrt{2}}\right), \quad (11)$$
$$\left(10, -\frac{1}{\sqrt{2}} + j\frac{1}{\sqrt{2}}\right), \left(11, \frac{1}{\sqrt{2}} + j\frac{1}{\sqrt{2}}\right)$$

As shown in Expression (6), in the second embodiment, as a scramble sequence is different from symbol to symbol, a pair of a bit sequence and a received symbol is also different for each replica signal. In MIL-STD, since the scramble sequence is used in a certain cycle, a replica signal on which a phase rotation process is performed in accordance with the scramble sequence for each symbol. It is also possible to generate a group of replica signals on which a phase rotation process for each of the replica signals from a scramble sequence 0 to 7 in advance, so that the group of replica signals is stored on an information storage medium such as ROM, and a second replica signal X'(k) can be read from the ROM in accordance with a scramble sequence S(k).

According to the second embodiment as explained above, it is possible to use a soft decision value in a decoding process without increasing an amount of process and not degrading a signal performance by decoding using a replica signal corresponding to a descramble process and a trans-decoding process. Furthermore, the apparatus according to the second embodiment can process more rapidly achieve than the wireless receiving apparatus according to the first embodiment.

In the following, general signal processing under MIL-STD will be explained as a conventional example.

First, signal processing at a wireless transmitting apparatus is explained. Suppose if a transmitted bit sequence after coding at a wireless transmitting apparatus is (010), for example. At first, a transmitted bit sequence (010) is transcoded, it will become a transmitted bit sequence (011), according to FIG. 3.

Subsequently, when a scramble process is performed on a transmit bit sequence (011), a transmitted bit sequence (011) and a scramble sequence (001) are added; as a result, the transmit bit sequence becomes (100).

Finally, the transmit bit sequence (100) is modulated, it will be mapped to 8-PSK signal points shown in FIG. 4, and a transmitted symbol (−1) is obtained.

Next, signal processing at a wireless receiving apparatus that receives a signal from a wireless transmitting apparatus is explained. The wireless receiving apparatus can obtain a bit sequence (100) by the replica signal at 8-PSK signal points shown in FIG. 4 through a demodulation process if a channel-equalized received symbol exists as (−1).

Subsequently, a descramble process (subtraction) is performed using a scramble sequence (001) which is used the wireless transmitting apparatus on the received bit sequence (100); as a result, a received bit sequence (011) is obtained.

Then, a trans-decoding process is performed on the received bit sequence (011) after the descramble process; as a result, an input bit (010) corresponding to an output bit (011) can be obtained based on the table shown in FIG. 3. Thus, the wireless receiving apparatus can obtain data from the wireless transmitting apparatus accurately.

A frame of MIL-STD is encoded on a transmitter side, a trans-decoded received bit sequence is decoded by a wireless receiving apparatus. However, with a wireless receiving apparatus such as the one described above, although a log-likelihood obtained from the decoding process can be treated as a soft decision value, a descramble process and a trans-decoding process can be performed only with a hard-decision value, such as bit calculation. For this reason, it would be difficult for a conventional wireless receiving apparatus to obtain a soft decision value after a trans-coding process.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A wireless receiving apparatus comprising:
a receiver configured to receive a first signal, the first signal having been processed with a bit conversion process, a scramble process and an M-phase shift keying modulation process, M being a positive integer;
a phase rotation module configured to multiply a first symbol obtained from the first signal with an amount of phase rotation determined by a scramble sequence used for the scramble process to obtain a second symbol; and
a demodulator configured to demodulate the second symbol by referring to signal points of an N-phase shift keying (N-PSK) replica signal generated based on a data rate and the bit conversion process and to calculate a likelihood obtained from demodulation as a soft decision value, wherein N is an integer and $2 \leq N \leq M$.

2. The apparatus according to claim 1, wherein the phase rotation module obtains the second symbol by rotating the first symbol at a first angle according to the scramble sequence by a unit of a second angle determined by dividing 2 pi with the number of signal points of the N-PSK on a complex plane.

3. The receiving apparatus according to claim 1, further comprising an RF module configured to estimate the first symbol based on the signal points of a modulation of the N-PSK if a most likelihood sequence estimate is used in a channel equalization process.

4. A wireless receiving method comprising:
receiving a first signal, the first signal having been processed with a bit conversion process, a scramble process and an M-phase shift keying modulation process, M being a positive integer;
multiplying a first symbol obtained from the first signal with an amount of phase rotation determined by a scramble sequence used for the scramble process to obtain a second symbol; and
demodulating the second symbol by referring to signal points of an N-phase shift keying (N-PSK) replica signal generated based on a data rate and the bit conversion process and to calculate a likelihood obtained from demodulation as a soft decision value, wherein N is an integer and $2 \leq N \leq M$.

5. The method according to claim 4, wherein the multiplying the first symbol obtains the second symbol by rotating the first symbol at a first angle according to the scramble sequence by a unit of a second angle determined by dividing 2 pi with the number of signal points of the N-PSK on a complex plane.

6. The method according to claim 4, further comprising estimating the first symbol based on the signal points of a modulation of the N-PSK if a most likelihood sequence estimate is used in a channel equalization process.

* * * * *